US006091060A

United States Patent [19]

Getchel et al.

[11] Patent Number: 6,091,060

[45] Date of Patent: Jul. 18, 2000

[54] POWER AND CONTROL SYSTEM FOR A WORKPIECE CHUCK

[75] Inventors: Paul A. Getchel, Placerville, Calif.; Henry A. Lyden, Wellesley, Mass.; Donald C. Miffitt, Chelmsford, Mass.

[73] Assignee: Temptronic Corporation, Newton, Mass.

[21] Appl. No.: 09/001,927

[22] Filed: Dec. 31, 1997

[51] Int. Cl.[7] .................................................... H05B 1/02

[52] U.S. Cl. .................... 219/483; 497/121.43; 497/519; 438/715; 118/725

[58] Field of Search ............................ 219/121.43, 121.4, 219/121.48, 121.58, 497, 483, 519; 156/626, 643.1, 345; 279/128; 392/416; 118/723, 725; 438/715

[56] References Cited

U.S. PATENT DOCUMENTS

| | | | |
|---|---|---|---|
| 4,607,220 | 8/1986 | Hollman | 324/158 |
| 4,682,857 | 7/1987 | Tan | 350/331 |
| 4,734,872 | 3/1988 | Eager et al. | 364/557 |
| 4,893,914 | 1/1990 | Hancock et al. | 350/530 |
| 5,147,497 | 9/1992 | Nozawa et al. | 156/626 |
| 5,567,267 | 10/1996 | Kazama et al. | 156/345 |
| 5,584,971 | 12/1996 | Komino | 204/192.13 |
| 5,610,529 | 3/1997 | Schwindt | 324/760 |
| 5,635,093 | 6/1997 | Arena et al. | 219/466 |
| 5,698,062 | 12/1997 | Sakamoto et al. | 156/345 |
| 5,737,177 | 4/1998 | Mett et al. | 361/234 |
| 5,753,132 | 5/1998 | Shamouilian et al. | 216/33 |
| 5,775,416 | 7/1998 | Heimanson et al. | 165/275 |
| 5,779,925 | 7/1998 | Hashimoto et al. | 156/643.1 |

OTHER PUBLICATIONS

Trio–Tech International, TC 8800 Thermal Chuck Operational Manual, 1996.

XantrexTechnology, XHR Series.

*Primary Examiner*—Mark Paschall

*Attorney, Agent, or Firm*—Samuels, Gauthier & Stevens LLP

[57] ABSTRACT

A system for and method of controlling the temperature of a flat workpiece such as a semiconductor wafer are disclosed. The workpiece is mounted on a workpiece chuck which is mounted over a base between the chuck and a host machine such as a wafer prober used to test integrated circuits on a wafer. The chuck includes an upper portion on which the workpiece is mounted. The temperature of the upper portion of the chuck is controlled to control the temperature of the workpiece. The temperature of the base is controlled to reduce the amount of heat flow between the chuck and the host machine. A power and control system includes a switching power supply which provides power to system components including heaters in the chuck used to heat the workpiece. A series of filters removes electrical noise generated by the switching power supply such that low-noise operation is realized.

38 Claims, 4 Drawing Sheets

POWER AND CONTROL SYSTEM FOR A WORKPIECE CHUCK

FIELD OF THE INVENTION

The present invention relates generally to power and control systems and more specifically to power and control systems used to control the temperature of a workpiece such as a semiconductor wafer and/or to control the temperature of the workpiece chuck on which the workpiece is held.

BACKGROUND OF THE INVENTION

In the semiconductor integrated circuit industry, the cost of individual integrated circuit chip die is continuing to decrease in comparison to IC package costs. Consequently, it is becoming more important to perform many IC process steps while the die are still in the wafer, rather than after the relatively expensive packaging steps have been performed.

Typically, in IC processing, semiconductor wafers are subjected to a series of test and evaluation steps. For each step, the wafer is held in a stationary position at a process station where the process is performed. For example, circuit probe testing is increasingly performed over a wide temperature range to temperature screen the ICs before assembly into a package. The wafer is typically held stationary relative to a vacuum support surface of a prober machine which electrically tests the circuits on the wafer. The prober includes a group of electrical probes which, in conjunction with a tester, apply predetermined electrical excitations to various predetermined portions of the circuits on the wafer and sense the circuits' responses to the excitations.

In a typical prober system, the wafer is mounted on the top surface of a wafer chuck, which is held at its bottom surface to a support structure of the prober. A vacuum system is typically connected to the chuck. A series of channels or void regions in communication with the top surface of the chuck conduct the vacuum to the wafer to hold it in place on the top surface of the chuck. The prober support structure for the chuck is then used to locate the wafer under the probes as required to perform the electrical testing on the wafer circuits.

The chuck can also include a temperature control system which raises and lowers the temperature of the chuck surface and the wafer as required to perform the desired temperature screening of the wafer. It is important to the accuracy of such testing that the temperature of the wafer and, therefore, the temperature of the chuck surface, be controlled as accurately and precisely as possible.

Various approaches to controlling the wafer temperature have been employed. In one prior system, the chuck includes a circulation system through which a cooling fluid is circulated. The cooling fluid is maintained at a constant cold temperature and is circulated through the chuck. Temperature control is realized by activating a heater which is also located in the chuck. The heater is cycled on and off as required to heat the chuck and the workpiece to the required temperature.

This approach has certain drawbacks. A large time lag occurs when heating the chuck because the circulation fluid is always maintained at a low temperature and is always circulating through the chuck. As a result, a large amount of time can be required to heat the chuck and workpiece to a high temperature. Also, the system can be inefficient since much of the energy provided to the heater is wasted in the presence of the circulating cold fluid. Additionally, energy used to cool the fluid is wasted when the chuck and workpiece are being heated.

In another prior system, both a temperature-controlled fluid and a chuck heater are used to control the workpiece temperature. In this system, the fluid is used to bring the workpiece to within a certain tolerance of the desired set point temperature. The heater is then cycled as required to trim the temperature to the set point. This system also suffers from long time lags and poor efficiency.

In still another prior art system, temperature control is implemented using only passive heat transfer to and from a fluid circulating through the chuck. In this system, the chuck is provided with a series of internal channels through which the temperature-controlled fluid is circulated. The chuck temperature is controlled by controlling the temperature of the fluid. This system also suffers from long time lags and relatively low efficiency.

In some applications, such as where a wafer is being tested on a circuit prober, it is important to reduce the electrical noise introduced into the system, since such noise can adversely affect the measurements being made by the prober. Introduction of noise into the measurement is a common problem where temperature testing of the wafer is being performed on the prober. Power and control signals applied to elements such as resistive chuck heaters are typically in close proximity to the wafer and, therefore, can be substantial sources of noise.

Therefore, it is important that power supplies that provide power to heating elements be as noise-free as possible. As a result, prior thermal chuck power systems include linear power supplies to provide power to heating elements. However, linear supplies tend to be very inefficient. In fact, their power dissipation is highly dependent on input voltage. Therefore, under conditions in which the input line power can vary, substantial inefficiency can result. Also, because the standard European line power voltage level is higher than that used in the U.S., the power dissipation of a linear supply would be higher in Europe than it would be in the U.S., thus requiring different supply and system designs or tolerance of substantial variation in power dissipation. In addition, linear supplies are not capable of power factor correction. Under new European standards soon to be implemented, high-power supplies must be power factor corrected. Linear supplies may not meet these new standards under certain conditions. Therefore, it would be desirable to have a workpiece chuck that is powered by noise-free power signals but does not rely on linear power supplies for power.

SUMMARY OF THE INVENTION

In one aspect, the present invention is directed to a temperature control system and method for controlling temperature of a workpiece such as a semiconductor wafer mounted on a workpiece chuck which provide increased temperature control accuracy and improved efficiency. The workpiece chuck has an upper portion on which the workpiece can be mounted. The upper portion is mounted over an intermediate layer such as a base which is located between the upper portion of the chuck and the host apparatus on which the chuck is being used, such as a wafer prober machine. The temperature control system includes means for controlling a temperature of the upper portion of the chuck to control the temperature of the workpiece and means for controlling a temperature of the base to affect heat flow between the chuck and the host apparatus. In one embodiment, the temperature of the base is controlled by a fluid circulated through the base. A portion of the fluid can also be circulated through the upper portion of the chuck to control the temperature of the upper portion of the chuck. In one embodiment, heat flow between the chuck and the host machine is reduced.

In one embodiment, the temperature control system of the invention includes a pump for circulating the fluid through the workpiece chuck. The system also includes means for transferring a portion of the fluid to the upper portion of the chuck to control the temperature of the workpiece and means for transferring another portion of the fluid to the base intermediate layer such that heat flow between the chuck and the host machine can be affected.

In one embodiment, the temperature control system includes a system for controlling the temperature of the fluid. This fluid temperature control system can include a refrigeration system through which the fluid flows to cool the fluid before it is pumped to the chuck. The fluid control system can also include one or more heaters for heating the fluid as required. The fluid control system can also include one or more valves or switches for controlling various fluid routing functions. For example, when it is required to heat the fluid, one or more valves may be controlled to cause the fluid to bypass the refrigeration system and/or to flow through one or more of the fluid heaters. This can result in substantial power savings by reducing unnecessary loads on the refrigeration system. In other circumstances, it may be desirable to cool the fluid. In this case, one or more valves can be controlled to route the fluid through the refrigeration system.

The valves can also be used to control whether the fluid is routed to the upper portion of the chuck to control the workpiece temperature or is routed to the base to set up the heat flow barrier between the chuck and the host machine. In one embodiment, two individually controllable flow paths are established. Under certain conditions, the valves are controlled to route a portion of the fluid to the upper portion of the chuck to control the workpiece temperature. At the same time, a second portion of the fluid can be routed to the base to maintain the base at or near ambient temperature and thereby prevent heat flow to and from the host machine. Under other conditions, the valves are controlled to route all of the fluid to the base.

In one embodiment, fluid heaters are provided in both fluid paths. The fluid heaters are individually controllable such that the temperatures of both portions of the fluid can be individually controlled.

The valves can also be used to control the amount of fluid circulated through the system. The pump can be bypassed by a controllable valve which, when activated, recirculates a predetermined portion of the fluid at the outlet of the pump back to its inlet to reduce the amount of fluid that reaches the chuck. The amount of circulating fluid can be thus reduced when the chuck is being heated, for example.

The temperature control system of the invention can also include one or more heaters in the chuck. The heater can be cycled on and off to provide heat to the chuck and workpiece as required. In one embodiment, the chuck heaters include resistive elements driven by a DC power supply. In one particular embodiment, two or more individually controllable resistive heaters are used to facilitate an efficient multiple-stage, e.g., two-stage, chuck heating procedure, as described below.

In one embodiment, the efficiency of the system of the invention is improved by effectively dividing the operating temperature range of the system into multiple subranges. Operation of the system in a particular subrange defines a set of operating parameters which are used to control the system. For example, in one embodiment, the operating temperature range is divided into two subranges, an upper subrange and a lower subrange. Selection of a set point in one of the subranges defines a particular set of conditions. The system of the invention uses these conditions to define a set of system operating parameters and to control the various components of the system to realize these parameters. For example, in one embodiment, where operation in the upper subrange is desired, the chuck heater is used to heat the chuck, and all of the fluid flows adjacent to the base to maintain it at ambient temperature. To accomplish this operating configuration, the valves are operated to route the fluid to the base and the heater is cycled as required.

The temperature control system of the invention also includes a plurality of temperature sensors which provide temperature feedback at various locations throughout the system. In one embodiment, at least one temperature sensor is provided in the fluid path to monitor the temperature of the fluid. Temperature sensors can be provided in the fluid path to the upper portion of the chuck and in the path toward the base to provide independent temperature monitoring of both paths. A sensor can also be provided in the upper portion of the chuck to monitor the workpiece temperature. By monitoring both the fluid temperature and the workpiece temperature, a form of dual-loop control is provided for the workpiece temperature control. This allows for more precise temperature control. A sensor can also be provided in the base and in the ambient environment. These sensors along with the fluid sensor allow for dual-loop control of the base temperature to eliminate heat flow between the chuck and the host machine.

In another aspect, the invention is directed to the power and control system and method which provide the power and control required to operate the temperature control system of the invention. Specifically, this aspect of the invention is directed to a power and control system and method which provide the power to run system heaters and the control required to operate the various valves and fluid heaters in the temperature control system of the invention. The power system of the invention is applicable to a workpiece chuck which includes at least one heater for heating the workpiece mounted on the workpiece chuck. The power system includes an interface over which power is transferred between the power system and the workpiece chuck heater. The system also includes a switching power supply for generating an output power signal which is coupled to the chuck heater across the interface to power the chuck heater.

In one embodiment, the power system of the invention also includes a filter which receives the output power signal from the switching power supply. The filter filters the signal to remove switching power supply noise from the signal. As a result, the power signal supplied to the chuck heater does not couple noise to the workpiece and therefore allows for very accurate workpiece measurements.

In one embodiment, the output power signal from the switching power supply is controllable such that it can be switched between an ON state and an OFF state. In the ON state, the power signal is applied to the heater. In the OFF state, no power is applied to the heater such that the heater is turned off. The output power signal from the switching power supply can also be coupled to an amplifier which is controllable such that the output power signal level can be varied. As a result, power delivered to the heater, and, therefore, heat provided by the heater, can be varied.

As mentioned above, in one embodiment, the chuck can actually include two or more resistive heating elements used to supply heat to the workpiece, and the switching power supply can provide two or more output power signals, each of which is connected to its own respective heating element. The output power signals can be separately controllable such that power supplied to the heating elements can be separately controlled. In this embodiment, the heating elements and the output signals can be configured to efficiently control changing the temperature of the workpiece by implementing a multiple-stage, e.g., two-stage, heating procedure. For example, in a two-heating-element configuration, where it is desired to rapidly raise the temperature of the workpiece a substantial amount, both power outputs and, therefore, both heating elements can be activated simultaneously. As the temperature of the workpiece increases beyond a first target threshold temperature, one of the heating elements can be turned OFF while the other continues to be used to adjust the temperature of the workpiece to a desired final target temperature.

In one embodiment, to implement this two-stage procedure, the first output power signal is switchable between ON and OFF states, and the other is applied to a controllable amplifier such that its level can be varied. While increasing the temperature to the first target temperature, both heaters can be turned ON. As the target threshold temperature is reached, the first heater can be switched OFF while the second adjustable heater remains ON. The amplifier can then be controlled to adjust the level of the output power signal delivered to the adjustable heater in order to accurately and precisely heat the workpiece to and maintain its temperature at the final target temperature. In another embodiment, both heaters can be left ON, even when the workpiece has reached its final temperature, particularly when it is required to maintain the workpiece at a high temperature. In yet another embodiment, three heaters can be used to implement the two-stage heating process; two of the heaters can be switchable, and the third can be variable. At the final temperature, one of the switchable heaters can be switched OFF and the other switchable heater and the variable heater can be left ON to maintain the workpiece at the final temperature.

The power and control system of the invention can also provide driver signals to control the valves and fluid heaters used in the temperature control system of the invention to control the temperature of the chuck and workpiece. In one embodiment, the control signals are relay driver signals which drive relays which, in turn, control operation of the valves and fluid heaters. The control system can receive inputs from the temperature sensors, a dewpoint alarm sensor switch and a fluid level switch and can use these inputs to generate the control signals required to control the system components to operate the system as required.

The temperature control of the invention provides numerous advantages over prior art systems. For example, because the power system of the invention uses switching power supplies, the system is far more energy efficient than systems which use linear power supplies. Also, because the switching power supply is power-factor corrected, it complies with new European power standards. Because of the unique filtering of the invention, the power supply outputs are realized with minimal noise. The temperature control system itself also provides advantages over prior art temperature control systems. For example, because the temperature of the base between the upper portion of the chuck and the host machine is maintained at ambient temperature, heat flow between the chuck and the host machine is substantially eliminated. Also, the use of plural subranges dividing the overall temperature range of the system provides for improved system efficiency. By dividing the temperature range of the system into smaller subranges, different control settings carefully tailored to a smaller temperature subrange can be employed. Again, this results in greater system efficiency.

BRIEF DESCRIPTION OF THE DRAWINGS

The foregoing and other objects, features, and advantages of the invention will be apparent from the following more particular description of preferred embodiments of the invention, as illustrated in the accompanying drawing. The drawing is not necessarily to scale, emphasis instead being placed upon illustrating the principles of the invention.

DETAILED DESCRIPTION OF THE DRAWINGS

Figure 1:
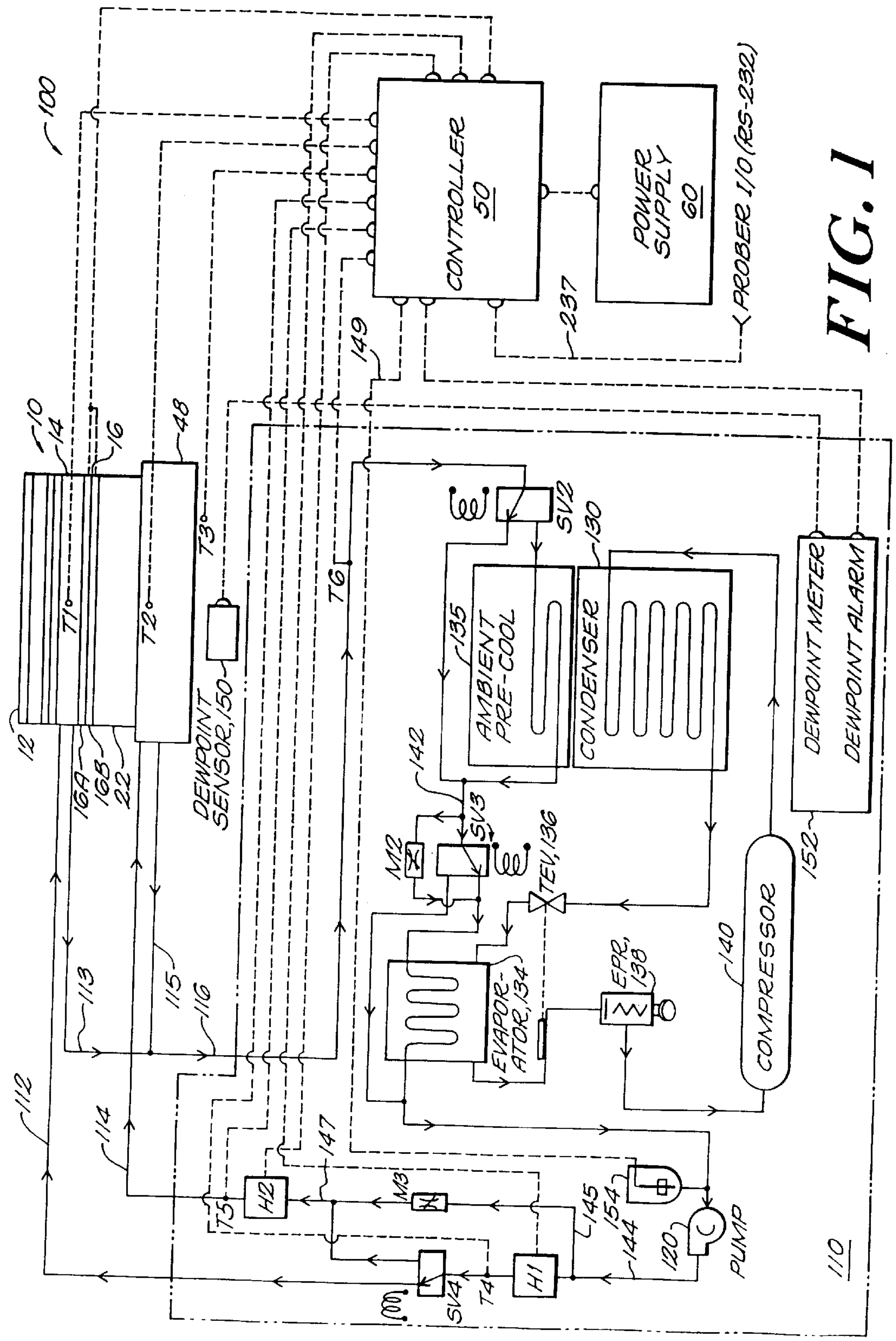
FIG. 1 is a schematic detailed block diagram of one embodiment of the temperature control system of the invention.

FIG. 1 is a schematic diagram of one embodiment of a temperature control system 100 in accordance with the present invention used in connection with a workpiece chuck 10. The chuck 10 can be used to hold on its top surface 12 a flat workpiece such as a semiconductor wafer during processing and can be of the form described in a copending patent application entitled "Workpiece Chuck," filed on even date herewith, assigned to the same assignee as the present application, and incorporated herein in its entirety by reference.

The processing performed on the workpiece can include electrical circuit testing on a wafer over a predetermined range of temperatures using a host machine such as a prober machine. To implement temperature cycling of the wafer, the chuck 10 includes a heat sink 14 through which fluid can be circulated and an electrical heater 16 which can be used to heat the wafer. The temperature control system 100 of the invention is used to control the heater 16 and the temperature and flow of fluid through the heat sink 14 in order to control the temperature of the chuck and, therefore, the temperature of the wafer under test. As described in detail below, in one embodiment, the heater 16, also referred to herein as H3, can actually include two resistive heating elements 16A and 16B, each of which is powered by its own individually controllable power signal provided by the power and control system of the invention. The heating elements 16A and 16B are individually controllable to permit implementation of a multiple-stage, e.g., two-stage, workpiece heating procedure as described below in detail.

It should be noted that in FIG. 1 broken or dashed lines indicate electrical connections and solid lines with arrowheads indicate lines for implementing flow of a thermodynamic medium such as the fluid used for controlling the temperature of the chuck or the refrigerant used to cool that fluid.

The system 100 of the invention can also be used to maintain a lower portion of the chuck 10 at ambient environment temperature to prevent heat flow between the chuck 10 and the host machine. To that end, the chuck 10 includes a lower support or plate 22, which can be a ceramic thermal and electrical insulating plate, which is mounted to a base 48. In one embodiment, the base 48 is part of the host machine on which the chuck 10 is mounted. In another embodiment, as shown in FIG. 1, the base 48 is part of the chuck. The base will be referred to herein as being part of the chuck 10, but it will be understood that it can also be a part of the host machine. In either case, the temperature of the base 48 is controlled to control heat flow between the chuck 10 and the host machine. The fluid can be circulated through the base 48 to maintain the base at ambient temperature. This sets up a heat flow barrier between the chuck and the host machine.

The temperature control system 100 of the invention includes a fluid temperature control module 110 which controls the temperature and the flow of fluid to and from the chuck 10. The fluid is carried into the heat sink 14 via an inlet line 112 and out of the heat sink 14 via a return line 113. The fluid can also be carried into the base 48 via another inlet line 114 and out of the base 48 via another return line 115. The two return lines 113 and 115 join together into a single return line 116 which returns the fluid to the fluid control module 110.

The system 100 of the invention also includes a power and control system which can include an electrical controller 50 and a power supply 60. As described below in detail, the controller 50 receives electrical input signals from various components of the system 100 and transmits electrical control signals to system components as required to perform the required temperature control functions of the system 110. The power supply 60 supplies power to the various system components and the controller 50 as required.

In one embodiment of the invention, temperature feedback is provided to the controller 50 by a series of temperature sensors located at various positions in the chuck 10 and the temperature control module 110. In the embodiment shown in FIG. 1, six temperature sensors, labeled T1–T6, are used. It should be noted that the references to T1–T6 contained herein can be to either the sensor itself or the temperature value it indicates. It will be clear from the context which is intended.

Sensor T1 is the chuck upper surface temperature sensor which indicates the chuck temperature at or near the heat sink 14. In one embodiment, before temperature testing, a calibration process is performed in which the difference between the temperature at sensor T1 and the actual temperature at the wafer is determined. During the calibration, temperature of the wafer at the top surface can be determined by a surface-mounted thermocouple or other temperature sensor, or by using a calibrated diode on the wafer, or by some other technique; and a correction factor is generated which identifies the temperature differential between sensor T1 and the wafer surface. That correction factor is used as an adjustment during subsequent temperature control processes to maintain the wafer at the desired temperature. Alternatively, a contact or non-contact temperature sensor can be used at the wafer surface to provide the T1 temperature measurement. This eliminates the need for the calibration. This temperature sensor can be a calibrated diode, a thermocouple or any other contact or non-contact sensor.

Sensor T2 is the base temperature sensor. It senses the temperature at the base 48. This temperature is maintained at or near ambient temperature (sensor T3) to prevent heat flow between the chuck 10 and the host machine. Sensor T3 is the ambient air/environment temperature sensor. It senses the ambient temperature of the environment around the chuck and the host machine. Ideally, by circulating fluid through the base 48, T2 is maintained as close as possible to T3 to prevent heat flow between the chuck and the host machine.

Sensor T4 is a fluid temperature sensor. It senses the temperature of the fluid as it flows out of the fluid heater Hi and before it flows to either the heat sink 14 via line 112 or the base 48 via fluid heater H2 and line 114, depending upon the state of valve SV4. The temperature at T4 is monitored to allow control of the fluid temperature as it enters the heat sink 14 or the base 48.

Sensor T5 is the base fluid temperature sensor. It senses the temperature of the fluid as it flows out of the fluid temperature control module 110 toward the chuck 10 along line 114. The temperature at T5 is monitored to allow control of the fluid temperature as it enters the base 48, such that the base temperature (T2) can be maintained near ambient temperature (T3).

Sensor T6 is the return fluid temperature sensor. It senses the temperature of the fluid as it returns from the chuck 10 along return line 116. It is used to determine whether thermodynamic processes such as pre-cool should be performed on the fluid before it is circulated back to the chuck 10.

It should be noted that other temperature sensor configurations can be used to carry out the invention. For example, sensors T1 and T2 can be located in return tubes 113 and 115, or additional sensors can be added to either or both of tubes 113 and 115.

The temperature control system 100 also includes the pair of fluid heaters H1 and H2 for heating the circulating fluid as required. Heater H2, the base fluid temperature control heater, heats fluid that is directed through the base 48. Heater H1, the chuck/base fluid temperature control heater, heats fluid that can be circulated through either the heat sink 14 or the base 48, depending on the state of SV4. As mentioned above, the system 100 also includes the chuck temperature control heater 16 (H3), which is located in the chuck 10 to provide heat directly to the chuck 10 to heat the workpiece and which can actually include multiple individually controllable heating elements 16A and 16B.

The flow of fluid through the system 100 is controlled via the controller 50 by a pump 120 and a series of valves. The pump 120 receives the fluid from the evaporator 134 and/or its bypass and accumulator 154 and pumps the fluid toward the fluid heaters H1 and H2 and then to the heat sink 14 and/or base 48.

The condenser 130, evaporator 134, thermal expansion valve 136, compressor 140 and pressure regulator 138 are used to implement a capacity-controlled refrigeration cycle that cools the fluid as required. Under particular predetermined circumstances described below, soleniod valves SV2 and SV3 are used to route the fluid through the refrigeration system as required to remove heat from the fluid. Under other circumstances, SV2 and SV3 are used to route the fluid such that it bypasses one or more portions of the refrigeration cycle. The ambient pre-cooler select solenoid valve SV2 is used to route the fluid through the ambient pre-cool heat exchanger 135. When ambient pre-cool is desired, SV2 is switched to its ON state to route the fluid through the pre-cool heat exchanger 135. When SV2 is OFF, as shown in FIG. 1, the fluid bypasses ambient pre-cool.

When further cooling of the fluid is desired, the fluid can be routed through the evaporator 134. The evaporator bypass select solenoid valve SV3 and the evaporator bypass coolant fluid metering valve M2 are used to control the flow of fluid through the evaporator 134. The metering valve M2 always allows a predetermined percentage of the fluid in line 142 to bypass the solenoid valve SV3 and flow into the evaporator 134 for cooling. In one embodiment, this percentage is set to about 15%. When SV3 is in its OFF state as shown in FIG. 1, all of the fluid in line 142 is routed through the evaporator for cooling. When SV3 is ON, the predetermined percentage (15%) of fluid flows into the evaporator 134, and the remaining fluid bypasses the evaporator 134 and flows toward pump 120.

A predetermined amount of the fluid at the outlet of pump 120 flowing in line 144 flows into heater H1. This amount is set by the base supply fluid metering valve M3. In one embodiment, M3 is set to cause 5% of the fluid in line 144 to bypass H1 and flow toward H2 in line 145 and the remaining 95% to flow through H1. Thus, in this embodiment, some portion of the fluid will always flow through the base 48, and the temperature of that portion is controllable.

Under certain conditions, such as when the chuck is being heated by the chuck heater(s) 16 (H3), the fluid out of heater H1 will be routed by the chuck heat sink bypass select solenoid valve SV4 to line 147 to flow through heater H2 and the base 48 instead of the heat sink 14. When SV4 is ON, all of the fluid out of both H1 and H2 flows through the base 48. When SV4 is OFF as shown, the fluid out of the heater H1 is routed through the heat sink 14.

The system 100 of the invention also incorporates a dewpoint sensor 150 and a dewpoint meter 152. The dewpoint sensor 150 detects the dewpoint in the ambient environment around the chuck 10 and generates and transmits an electrical signal indicative of the sensed dewpoint to the dewpoint meter 152. The dewpoint meter 152 can send a dewpoint alarm signal to the controller 50 by closing a switch if the dewpoint rises above a particular value. Corrective actions such as heating the chuck to ambient and shutting down the system can be taken to avoid damage to the workpiece due to environmental factors such as frost formation.

The accumulator 154 serves as a reservoir for the fluid circulated through the chuck 10. The accumulator holds enough fluid to accommodate expansion and contraction of the fluid over the wide operating temperature range of the system. A signal indicating a low fluid level is generated by the accumulator 154 and transmitted to the controller 50 on line 149.

The controller 50 can also receive inputs from the host machine, e.g., prober, via an RS-232 interface 237. The RS-232 interface allows the host machine to communicate to the chuck such information as new chuck temperature set points.

The control logic used by the temperature control system 100 of the invention will now be described in detail. Certain variables are defined in connection with the operation of the system 100. $T_C$ is defined as the temperature set point for the chuck 10. It is the temperature to which it is presently desired to set the chuck. $T_{EB}$ is the evaporator bypass switching temperature. It is a constant positive number to which $T_C$ is compared under some conditions. $T_S$ is the support plate or base temperature set point and is typically approximately equal to T3, the ambient air/environment temperature. $DT_C$ is the chuck temperature deviation which is a measure of the difference between the chuck temperature T1 and the chuck temperature set point $T_C$, i.e., $DT_C=T1-T_C$.

$DT_S$ is the maximum value of chuck temperature deviation for which the chuck is defined to be at steady state and is typically equal to a constant positive number between 1 and 5° C. The chuck temperature is considered to be at steady state when the magnitude of the difference between the actual temperature and the set point ($DT_C$) is small, that is, when the actual temperature is only slightly different from the desired temperature. Specifically, the chuck is considered to be at steady state when $-DT_S<DT_C<DT_S$.

The system of the invention controls temperature of the chuck and workpiece over a wide range of temperatures. In one embodiment, the temperature range is effectively divided into a lower subrange and an upper subrange. In the lower subrange, the temperature of the chuck 10 and workpiece are controlled by fluid flow through the chuck 10 only; the chuck heater 16 (H3) is not activated. This is true even when the temperature set point may be above ambient temperature. In that case, the fluid provides the required heating. In the upper subrange, the chuck heater 16 is used to heat the chuck 10 and workpiece. The temperature at the boundary between the lower subrange and the upper subrange will be referred to herein by $T_B$. In one embodiment, $T_B$=+40° C. Hence, where the total temperature range is, for example, −10° C. to +200° C., the lower subrange can extend from −10° C. to +39.9° C., and the upper subrange can extend from +40° C. to +200° C. Other temperature subranges can also be selected.

To describe the logical operation of the system 100, the settings of the various components of the system 100 will be described along with the physical system conditions under which the settings are made. As mentioned above, the compressor 140 and condenser 130 are part of a refrigeration system which is controllable to control the temperature of the fluid circulated through the chuck 10 in accordance with the present invention. The compressor 140 and condenser fan are ON when the system 100 is in operation and OFF otherwise. The pump 120 used to circulate the fluid through the chuck 10 is also ON when the system 100 is in operation and OFF otherwise.

Valve SV2 will be turned ON to implement the ambient pre-cool by routing the fluid through the pre-cool heat exchanger 135 when it is desired to cool the chuck to a set point temperature that is far enough below the current actual chuck temperature $T_1$ to take the system out of steady state, i.e., $DT_C>DT_S$, and the temperature $T_1$ is greater than $T_B$. Otherwise, SV2 will be turned OFF to bypass the ambient pre-cool.

As described above, when solenoid valve SV3 is OFF as shown in FIG. 1, the fluid is routed through the evaporator 134 to cool the fluid. When SV3 is ON, most of the fluid is routed to heater H1 to heat the fluid. SV3 will be turned ON under either of two sets of conditions. It will be ON when it is desired to heat the chuck to a temperature that is high enough above the current actual chuck temperature to take the system out of steady state, i.e., $DT_C<-DT_S$. Alternatively, SV3 will be ON when the system is in the steady state condition, i.e., $-DT_S<DT_C<DT_S$, and it is desired to operate the system in the upper temperature subrange, i.e., $T_C \geqq T_B$. Otherwise, SV3 will be turned OFF to cool the fluid.

As described above, solenoid valve SV4 controls whether the fluid out of heater H1 is routed to the heat sink 14 or the base 48. When SV4 is ON, the fluid is routed to the base 48; when SV4 is OFF, the fluid is routed to the heat sink 14. SV4 will be turned ON when it is desired to operate the system in the upper temperature subrange, i.e., when $T_C>T_B$, except when it is desired to cool the chuck to a set point temperature that is far enough below the current actual chuck temperature to take the system out of steady state, i.e., when $DT_C > DT_S$. Otherwise, SV4 will be ON.

The heaters H1, H2 and H3 can be controlled by proportional-integral-derivative (PID) control loops implemented in the controller 50. The various temperature sensors T1–T6 provide the required temperature feedback which allows the controller 50 to control the heaters. The controller 50 provides pulse-width modulated signals to cycle the heaters on and off as required.

Heater H1 is cycled ON via the PID control to maintain the chuck temperature T1 equal to the set point temperature $T_c$ when it is desired to operate the system in the lower temperature subrange, i.e., when $T_C < T_B$, except when it is desired to cool the chuck to a temperature that is far enough below the current actual chuck temperature to take the system out of steady state, i.e., when $DT_C > DT_S$. Heater H1 is also cycled ON to maintain the support plate temperature T2 equal to the ambient air/environment temperature T3 when it is desired to operate the system in the upper temperature subrange, i.e., when $T_C \geqq T_B$, except when it is desired to cool the chuck to a temperature that is far enough below the current actual chuck temperature to take the system out of steady state, i.e., when $DT_C > DT_S$. Heater H1 is OFF under other conditions.

Heater H2 is cycled ON via the PID control to maintain the base temperature T2 equal to the ambient air/environment temperature T3 except when SV4 is turned ON to cause the fluid out of heater Hi to flow through the base 48. In this case, heater H1 handles the bulk of the heating load for the fluid. Under other circumstances, heater H2 is OFF.

The chuck heater H3 is cycled on via PID control to maintain the temperature of the chuck T1 equal to the set point temperature $T_C$ when it is desired to operate the system in the upper temperature subrange, i.e., when $T_C \geqq T_B$, except when it is desired to cool the chuck to a temperature that is far enough below the current actual chuck temperature to take the system out of steady state, i.e., when $DT_C > DT_S$. Under other conditions, the heater H3 is OFF.

Figure 2:
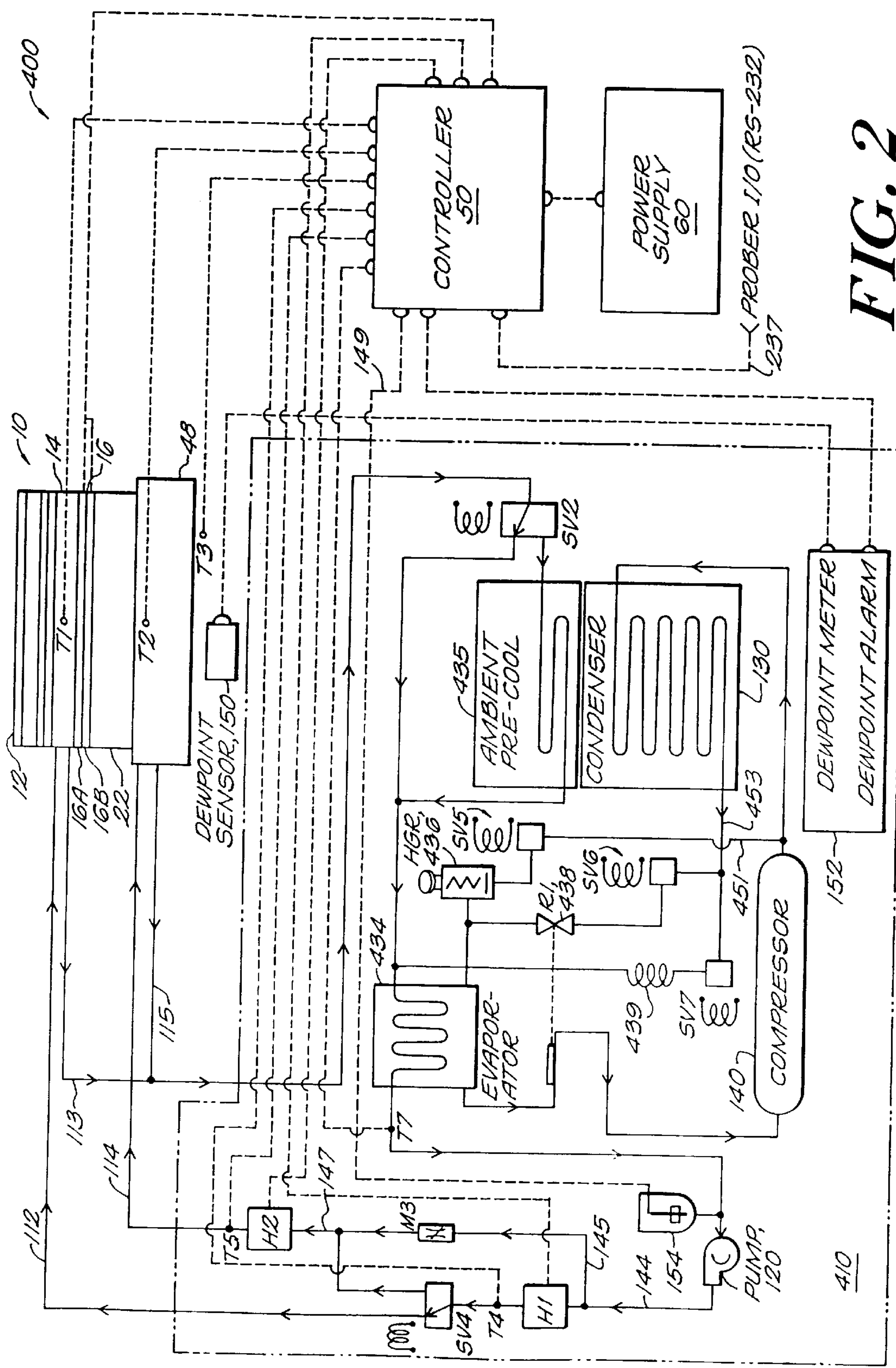
FIG. 2 is a schematic detailed block diagram of an alternative embodiment of the temperature control system of the invention.

FIG. 2 is a schematic detailed block diagram of an alternative embodiment 400 of the temperature control system of the invention. The components and control logic described above in connection with FIG. 1 are the same as those of FIG. 2 with some exceptions as described below. The embodiment 400 of FIG. 2 uses a different fluid temperature control system 410 than the embodiment 100 described in connection with FIG. 1. The fluid refrigeration system of FIG. 2 includes a condenser 130 and an evaporator 434. The refrigerant used to cool the circulation fluid exits the condenser 130 along line 453 and enters an expansion valve 438 where it is throttled before it enters the evaporator 434. The solenoid valve SV2 can be used to bypass the ambient pre-cool heat exchanger 435 when further cooling of the chuck temperature control fluid is not desired. However, the solenoid valve SV3 of the embodiment of FIG. 1, used to bypass the evaporator where further cooling is not required, is not included in the fluid temperature control system 410 of the embodiment 400 of FIG. 2. Instead, when further cooling of the fluid is not desired, the normally closed soleniod valve SV6 is held closed to shut off cold refrigerant to the evaporator, and hot gas from the compressor is fed along line 451 into the evaporator 434 to provide heating of the fluid. In one embodiment, when this extra heating is desired, the optional hot gas bypass enable solenoid valve SV5 is opened to allow the hot gas from the compressor 140 to be transmitted to the evaporator 434. A hot gas pressure regulator 436 is used to control the amount of hot gas introduced to the evaporator 434 according to the amount of heating required.

Hence, SV6 is used in controlling the fluid temperature by modulating refrigeration capacity at the evaporator heat exchanger 434. SV6 may be controlled through a controller PID loop to maintain fluid temperature as precisely as required.

In one embodiment another optional valve SV7 is included between the condensor 130 and evaporator 434. Valve SV7 feeds a fast response metering device which, in one embodiment, can be a capillary tube 439. SV7 can also be controlled through a PID loop. It differs from SV6 however in that it controls a lower capacity, faster responding metering device (capillary tube 439). Where this arrangement is used, SV6 can be energized for maximum capacity, during transitions for example. SV7 can then be used to maintain the set point precisely after transition while SV6 is deenergized.

Also, temperature sensor T6 in FIG. 1 is eliminated from the embodiment of FIG. 2 and another temperature sensor T7 is added. Sensor T7 is the evaporator fluid outlet temperature sensor. It senses the temperature of the fluid as it leaves the evaporator heat exchanger 434. The sensed temperature at T7 is used to adjust the refrigeration capacity of the fluid refrigeration subsystem which includes condensor 130, compressor 140 and evaporator 434.

Figure 3:
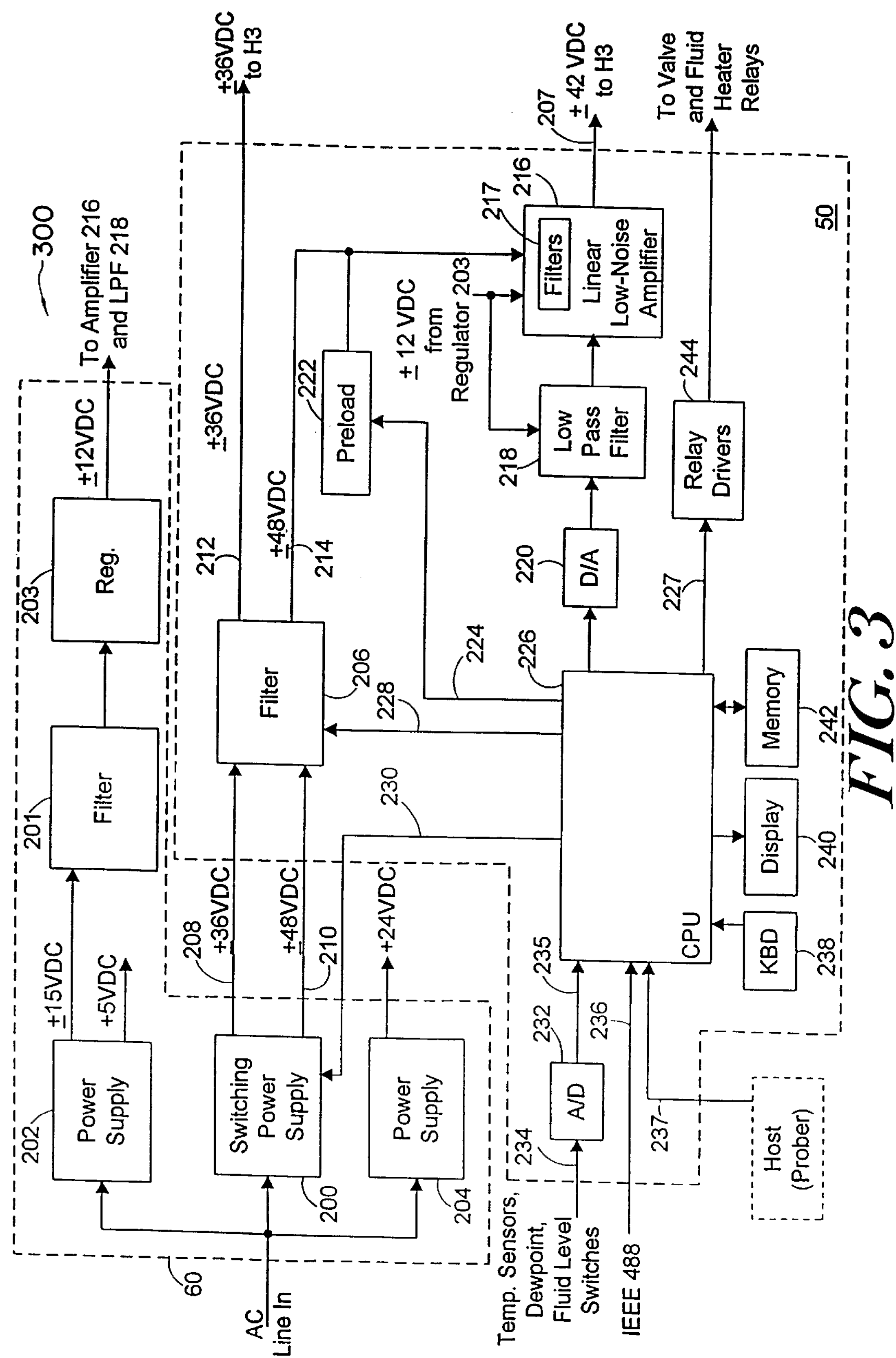
FIG. 3 is a schematic block diagram of one embodiment of the power and control circuitry of the invention.

FIG. 3 contains a schematic block diagram of one embodiment of the power and control system 300 of the invention. The system 300 includes the power supply 60 and controller 50 referred to above. It generates power signals required to operate the chuck heater 16 (H3) containing resistive heating elements 16A and 16B and the control signals used to operate the solenoid valves and fluid heaters H1 and H2 as described above.

The power supply 60 portion of the power and control system 300 can include three power supply modules 200, 202 and 204 which receive AC line input power. In the present invention, the input power can be standard 115 VAC, 60 Hz or can comply with European standards. The switching power supply module 200 provides the main power signals used to drive the chuck heater H3. As described above, in one embodiment, the chuck heater H3 is actually made up of two resistive heating elements 16A and 16B, each of which is driven by its own separately controllable power signal. To accommodate the use of the two heaters 16A and 16B, the switching power supply module 200 generates two sets of DC outputs on lines 208 and 210 to drive the heating elements 16A and 16B in H3. One set of output lines 208 provides an output power output signal of ±36 VDC and output lines 210 provide an output power signal of ±48 VDC.

The remaining power supply modules 202 and 204 can also be switching power supplies. One of the modules 202 can supply +5 VDC to drive logic in the remainder of the system. The module 202 can also provide ±15 VDC to drive amplifier, filtering and other circuitry in the control system 50. The ±15 VDC is applied to a filter 201 and is then regulated by a regulator 203 to a voltage of ±12 VDC before it is applied to the linear low-noise amplifier 216 and the low-pass filter (LPF) 218 of the control circuitry 50. The linear low-noise amplifier 216 includes additional filtering circuitry 217 for filtering the ±12 VDC signal. The LPF 218 also includes further filtering for the ±12 VDC. All of this regulation and filtering are used to provide noise-free DC power to the amplifier and LPF such that low-noise power signals can be provided to the heating elements 16A and 16B. The other power supply module 204 can be used to generate a +24 VDC signal which can be used to drive a system fan to provide cooling.

The ±36 VDC and ±48 VDC signals are applied to filtering circuitry 206 in the controller 50 to remove from the signals noise introduced by the switching power supply 200 or by other sources of noise. As described above, the heating elements 16A and 16B in H3 driven by the power supply 200 outputs are preferably located in the workpiece chuck which can be located on a circuit prober machine and used to hold a wafer while circuit testing is performed. In this configuration, it is important that noise coupled to the system be minimized, since such noise could interfere with the testing being performed by the prober and thereby produce inaccurate results. The filtering circuitry 206 is therefore important in improving the accuracy of circuit measurements performed by the prober.

Filtered power supply outputs are provided out of the filter 206 on lines 212 and 214. In one embodiment, ±36 VDC is provided on line 212 directly to a first heating element 16A of heater H3 in the workpiece chuck. Additionally, ±48 VDC is provided on line 214 to a linear low-noise amplifier 216 which controls the level of voltage applied to the second resistive heating element 16B in heater H3. In one embodiment, a bipolar or double-ended DC voltage is provided at the output of the linear low-noise amplifier 216 on lines 207. The voltage level provided out of the amplifier 216 is variable between 0 VDC and ±42 VDC. By varying the level of voltage applied to the second resistive element 16B, the amount of heat provided by the heater can be varied. Thus, by controlling the voltage out of the amplifier 216, the temperature of the workpiece can be controlled.

The output level on lines 207 from the linear low-noise amplifier 216 is controlled by an analog signal input provided by a digital-to-analog (D/A) converter 220 whose output is controlled by data from a central processing unit (CPU) 226. The analog signal from the D/A 220 is filtered by a low-pass filter 218 to remove D/A switching noise from the signal, which can be substantial during an active control loop. The signal is then passed to the linear low-noise amplifier 216 to precisely control the level of signal applied to the second heating element 16B in heater H3. The low-pass filter 218 and the low-noise amplifier 216 remove practically all of the residual noise from the signal, such as digital switching noise introduced by the D/A 220 or CPU 226, such that a clean, relatively noise-free signal is applied to the heater H3. In one embodiment, a signal with less than 250 $\mu$V peak noise is obtained.

The power system of the invention also includes a controllable preload 222 which is applied to the ±48 VDC output from the filter 206. The CPU 226 controls application of the preload 222 via control line 224. The preload 222 is applied in situations in which the output from the linear low-noise amplifier 216 is set at a relatively low level. Under this condition, without the preload, the switching power supply 200 would operate under a relatively light load and would tend to generate excessive noise. By applying the preload 222, the switching power supply 200 is loaded down to reduce the amount of noise that it generates.

The CPU 226 also provides control signals on lines 227 to relay drivers 244. The relay drivers 244 provide appropriate signals to relays which control operation of the solenoid valves and heaters H1 and H2 in the temperature control system 100 of the invention. The relays can be, for example, semiconductor relays. The CPU can also include an IEEE 488 interface 236 as well as an RS-232 interface 237 over which the CPU 226 can communicate with the host machine, e.g., circuit prober. The CPU can receive inputs, such as workpiece temperature set points, from the host machine via the RS-232 interface 237. The CPU 226 also includes associated memory 242 which can include ROM and RAM in which are stored data and instructions required to perform the functions of the invention. The CPU also includes a user interface which can include a keyboard 238 and a display 240.

The CPU 226 also provides control lines 230 to the switching power supply 200 as well as control lines 228 to the filter 206. The control lines 230 are used to selectively switch the ±36 and ±48 VDC output power signals ON and OFF. One or both of the power signals can be switched OFF when not in use to reduce system power consumption and the amount of noise introduced by the switching power supply 200.

In one embodiment, the control lines 230 can be used to switch at least one of the output power signals, preferably the ±36 VDC signal, ON and OFF. The control signals 230 are used to switch one or more relays between an open and closed state. When the relays are opened, the corresponding output power signal is switched OFF. When the relay is closed, the output is switched ON. In one embodiment, control lines 228 to the filter 206 can also be used to switch output power signals on lines 212 and 214 between ON and OFF states by controlling relays in the filter circuitry 206.

The CPU 226 receives system inputs from the temperature sensors T1 through T6, the dewpoint sensor alarm switch 152 and the accumulator low-fluid-level switch. The outputs of these sensors and switches are received by the controller 50 along lines 234 which apply the sensor outputs to the A/D converter 232. The A/D converter 232 converts the signals to digital signals, which are transferred along lines 235 to the CPU 226. The CPU 226, operating under the control of instructions stored in memory 242, processes these various inputs, as well as any information from the host machine or user such as a temperature set point, and generates appropriate control signals in accordance with the system logic described above to control the temperature of the workpiece as required. The control signals generated by the CPU 226 include the signals on lines 228 and 230 to switch heater power signals ON and OFF, signals to D/A converter 220 to control the level of the signal output by the linear low-noise amplifier 216, the preload control signal on line 224 and relay control lines 227.

In one embodiment, one of the heating elements 16A in H3 receives the ±36 VDC output signal from the filter 206 on lines 212. In this embodiment, the second resistive heating element 16B receives the controllable ±42 VDC signal from the linear low-noise amplifier 216. The ±36 VDC signal can be switched ON and OFF via control lines 230 and/or 228 such that the first resistive heating element 16A can be switched ON and OFF. As described above, the voltage level on lines 207 to the second resistive heating element 16B can be controlled via the CPU 226, D/A converter 220 and the amplifier 216. By varying the voltage signal on lines 207, the heat provided by the second resistive heating element 16B can also be varied. In one embodiment, this configuration allows for a two-stage chuck heating process which makes the system of the invention much more efficient than prior systems that include single-stage heating processes, especially when it is desired to heat the workpiece to a temperature substantially higher than its present temperature. This is true, for example, when the temperature set point is changed to a temperature much higher than the present temperature of the workpiece during temperature cycling.

Under these conditions, in the first step of the two-stage procedure, both resistive heating elements 16A and 16B in heater H3 are turned ON, and the voltage level provided on lines 207 to the second resistive heating element 16B is adjusted to its maximum value. When the temperature of the workpiece reaches a first preset target threshold temperature, the first resistive heating element 16A can be switched OFF by switching OFF the ±36 VDC signal on lines 212. This can be accomplished via control lines 230 and/or control lines 228. Next, the voltage level provided to the second resistive heating element 16B on lines 207 is controlled to bring the temperature of the workpiece to the desired final set point target temperature. This control is accomplished by the CPU 226 receiving inputs on lines 235 and providing the appropriate signals to the amplifier 216 to bring the workpiece to the target temperature. In an alternative embodiment, both of the heating elements 16A and 16B can be left ON after the workpiece reaches the final temperature when a relatively high amount of heat is required, such as when the workpiece is being maintained at a high temperature.

In another alternative embodiment, the chuck heater 16 (H3) can include three resistive heating elements, including two switchable elements and one variable element. When the workpiece is being heated, all three heating elements can be turned ON. When the final temperature is reached, one of the switchable heaters can be turned OFF while the other switchable heater and the variable heater remain ON to maintain the workpiece at the final temperature.

Figure 4:
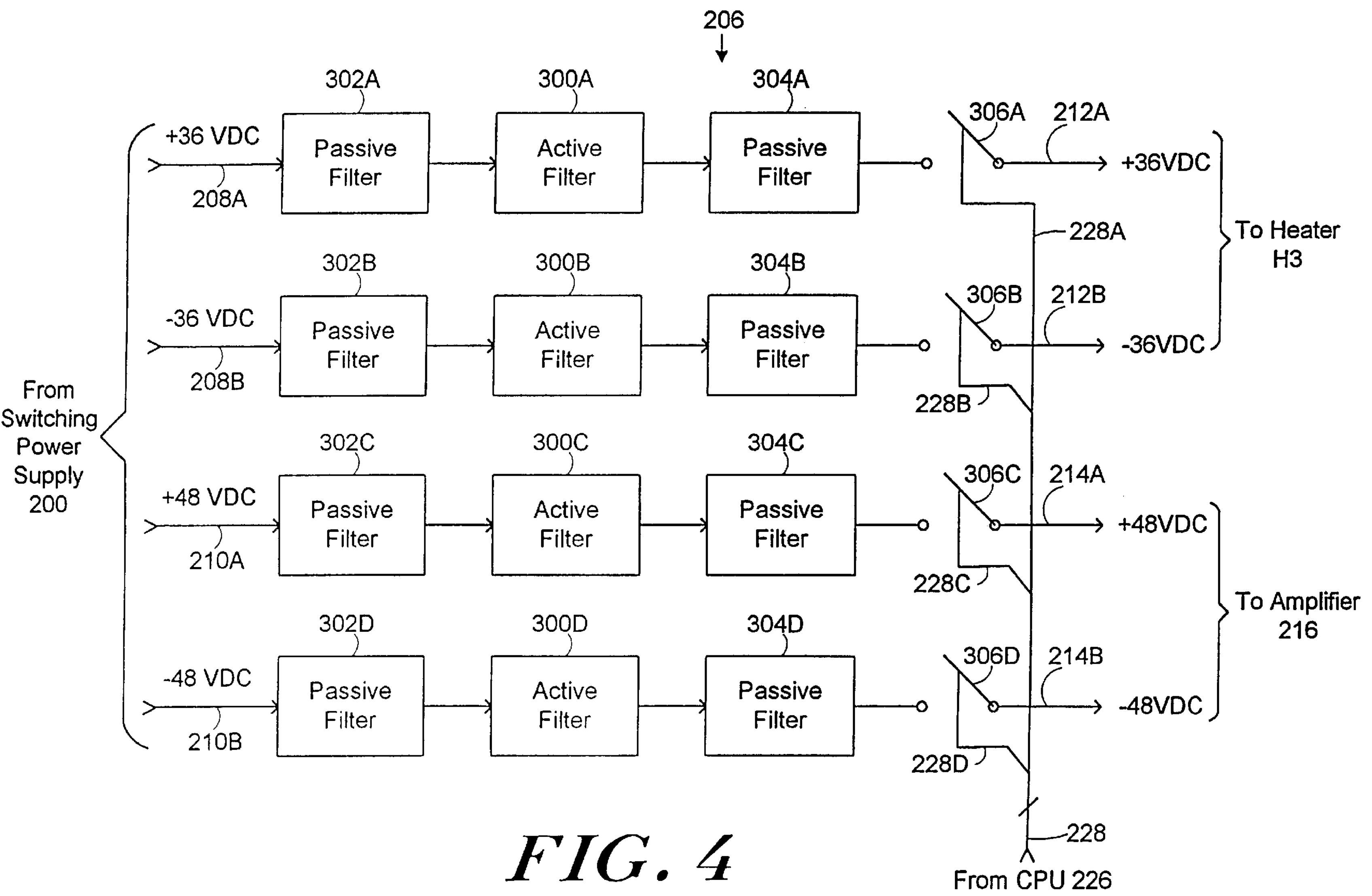
FIG. 4 is a schematic block diagram of one embodiment of an electrical noise filter in accordance with the present invention.

FIG. 4 is a schematic block diagram of one embodiment of the filter 206 of the invention. As shown in FIG. 4, the filter 206 receives the ±36 VDC inputs on lines 208; specifically, +36 VDC is received on line 208A and −36 VDC is received on line 208B. Also, the ±48 VDC signals are received on line 210; specifically +48 VDC is received on line 210A and −48 VDC is received on line 210B.

To remove switching power supply noise, each output signal is applied to a series of filters. In the embodiment shown in FIG. 4, each signal is first applied to a passive filter network 302 and then to an active filter stage 300. Next, a second passive filter stage 304 receives the signals and routes the resulting filtered DC signals to a relay 306. The relays 306A–306D are controllable by control lines 228A–228D from the CPU 226. Each output power signal is routed out of the filter 206 when its respective relay 306 is closed via a control line 228. The ±36 VDC signals are routed to the first heating element of heater H3 via lines 212; specifically, +36 VDC is routed via line 212A and −36 VDC is routed via line 212B. The ±48 VDC signals are routed to the linear low-noise amplifier 216 via lines 214; specifically, +48 VDC is routed to the amplifier 216 via line 214A and −48 VDC is routed to the amplifier 216 via line 214B.

This series of filters 302, 300 and 304 removes switching noise from the output signals from the switching power supply 200. As a result, the signals out of the filter 206 can be applied to the heaters in the workpiece chuck without coupling switching power supply noise to the workpiece and the machine performing workpiece testing.

While this invention has been particularly shown and described with references to preferred embodiments thereof, it will be understood by those skilled in the art that various changes in form and details may be made therein without departing from the spirit and scope of the invention as defined in the following claims.

What is claimed is:

1. A power system for a thermal workpiece chuck, said workpiece chuck comprising at least one heater for heating a workpiece mounted on the workpiece chuck, said power system comprising:

an interface over which power is transferred between the power system and the at least one heater; and a power source having a switching power supply, said power source generating a dual-polarity direct current (DC) output power signal, said DC output power signal being coupled to the at least one heater across the interface to power the at least one heater.

2. The power system of claim 1 wherein the power source further comprises a filter for removing electrical noise from the DC output power signal.

3. The power system of claim 1 further comprising a controller for controlling the interface such that the DC output power signal can be switched between an on state and an off state.

4. The power system of claim 1 further comprising an amplifier for amplifying the DC output power signal.

5. The power system of claim 4 wherein the amplifier is controllable such that a level of the DC output power signal is variable.

6. The power system of claim 5 wherein the amplifier is controllable via an output signal from an analog-to-digital converter.

7. The power system of claim 6 further comprising a filter for filtering the output signal from the analog-to-digital converter.

8. The power system of claim 1 wherein:

the thermal workpiece chuck includes first and second heaters for heating the workpiece; and the switching power supply generates a second DC output power signal, each of the first and second DC output power signals being coupled to a respective one of said first and second heaters.

9. The power system of claim 8 further comprising first and second filters for removing electrical noise from the first and second DC output power signals.

10. The power system of claim 8 further comprising a controller for controlling the interface such that one of the first and second DC output power signals can be switched between an on state and an off state.

11. The power system of claim 10 further comprising an amplifier for amplifying the other of the first and second DC output power signals.

12. The power system of claim 11 wherein the amplifier is controllable such that a level of the other of the first and second DC output power signals is variable.

13. The power system of claim 8 further comprising an amplifier for amplifying one of the first and second DC output power signals.

14. The power system of claim 13 wherein the amplifier is controllable such that a level of the one of the first and second DC output power signals is variable.

15. A method of providing power to a thermal workpiece chuck having at least one heater for heating a workpiece mounted on the workpiece chuck, said method comprising:

providing an interface over which power is transferred to the at least one heater;

providing a power source with a switching power supply, said power source generating a dual-polarity direct current (DC) output power signal; and coupling said DC output power signal to the at least one heater across the interface to power the at least one heater.

16. The method of claim 15 further comprising filtering the DC output power signal to remove electrical noise from the DC output power signal.

17. The method of claim 15 further comprising controlling the interface such that the DC output power signal can be switched between an on state and an off state.

18. The method of claim 15 further comprising applying the DC output power signal to an amplifier.

19. The method of claim 18 further comprising controlling the amplifier such that a level of the DC output power signal is variable.

20. The method of claim 19 wherein the amplifier is controlled via an output signal from an analog-to-digital converter.

21. The method of claim 20 further comprising filtering the output signal from the analog-to-digital converter.

22. The method of claim 15 wherein:

the thermal workpiece chuck includes first and second heaters for heating the workpiece; and the switching power supply generates a second DC output power signal, each of the first and second DC output power signals being coupled to a respective one of the first and second heaters.

23. The method of claim 22 further comprising providing first and second filters for removing electrical noise from the first and second DC output power signals.

24. The method of claim 22 further comprising controlling the interface such that one of the first and second DC output power signals can be switched between an on state and an off state.

25. The method of claim 24 further comprising applying the other of the first and second DC output power signals to an amplifier.

26. The method of claim 25 further comprising controlling the amplifier to vary a level of the other of the first and second DC output power signals.

27. The method of claim 22 further comprising applying one of the first and second DC output power signals to an amplifier.

28. The method of claim 27 further comprising controlling the amplifier to vary a level of the one of the first and second DC output power signals.

29. A method of controlling temperature of a workpiece mounted on a workpiece chuck, said workpiece chuck comprising first and second heaters for heating the workpiece, said method comprising:

providing a power supply which generates first and second power supply output signals;

coupling the first and second power supply output signals to respective ones of the first and second heaters;

switching one of the first and second power supply output signals between an on state and an off state to switch the respective one of the first and second heaters between an on state and an off state; and varying a level of the other of the first and second power supply output signals to vary a level of heat provided by the other of the first and second heaters.

30. The method of claim 29 wherein varying a level of the other of the first and second power supply output signals comprises:

coupling the other of the first and second power supply output signals to a controllable amplifier; and controlling said amplifier to vary the level of the other of the first and second power supply output signals.

31. The method of claim 29 further comprising:

switching the one of the first and second power supply output signals to the on state to switch the respective one of the first and second heaters to the on state;

when the workpiece reaches a first target temperature, switching the one of the first and second heaters to the off state and varying the level of the other of the first and second power supply output signals to vary the level of heat provided by the other of the first and second heaters to maintain the temperature of the workpiece at a second target temperature.

32. A power system for a thermal workpiece chuck, said workpiece chuck comprising at least one heater for heating a workpiece mounted on the workpiece chuck, said power system comprising:

an interface over which power is transferred between the power system and the at least one heater;

a switching power supply for generating an output power signal, said output power signal being coupled to the at least one heater across the interface to power the at least one heater; and an amplifier for amplifying the output power signal, said amplifier being controllable via an output signal from an analog-to-digital converter such that a level of the output power signal is variable.

33. The power system of claim 32 further comprising a filter for filtering the output signal from the analog-to-digital converter.

34. A power system for a thermal workpiece chuck, said workpiece chuck comprising first and second heaters for heating a workpiece mounted on the workpiece chuck, said power system comprising:

an interface over which power is transferred between the power system and the first and second heaters;

a switching power supply for generating first and second output power signals, each of said first and second output power signals being coupled to a respective one of said first and second heaters across the interface to power the first and second heaters; and a controller for controlling the interface such that one of the first and second output power signals can be switched between an on state and an off state.

35. The power system of claim 34 further comprising an amplifier for amplifying the other of the first and second output power signals.

36. The power system of claim 35 wherein the amplifier is controllable such that a level of the other of the first and second output power signals is variable.

37. A method of providing power to a thermal workpiece chuck having at least one heater for heating a workpiece mounted on the workpiece chuck, said method comprising:

providing an interface over which power is transferred to the at least one heater;

providing a switching power supply for generating an output power signal;

applying the output power signal to an amplifier;

controlling the amplifier via an output signal from an analog-to-digital, converter such that a level of the output power signal is variable; and coupling said output power signal to the at least one heater across the interface to power the at least one heater.

38. The method of claim 37 further comprising filtering the output signal from the analog-to-digital converter.

* * * * *